(12) United States Patent  
Okada et al.

(10) Patent No.: US 8,351,244 B2  
(45) Date of Patent: Jan. 8, 2013

(54) MEMORY CELL ARRAY, NONVOLATILE STORAGE DEVICE, MEMORY CELL, AND METHOD OF MANUFACTURING MEMORY CELL ARRAY

(75) Inventors: Takashi Okada, Osaka (JP); Takumi Mikawa, Shiga (JP); Koji Arita, Osaka (JP)

(73) Assignee: Panasonic Corporation, Osaka (JP)

( * ) Notice: Subject to any disclaimer, the term of this patent is extended or adjusted under 35 U.S.C. 154(b) by 198 days.

(21) Appl. No.: 13/001,695

(22) PCT Filed: May 28, 2010

(86) PCT No.: PCT/JP2010/003597  
§ 371 (c)(1),  
(2), (4) Date: Dec. 28, 2010

(87) PCT Pub. No.: WO2010/137339  
PCT Pub. Date: Dec. 2, 2010

(65) Prior Publication Data  
US 2011/0103133 A1    May 5, 2011

(30) Foreign Application Priority Data  
May 28, 2009    (JP) ................... 2009-128454

(51) Int. Cl.  
*G11C 11/00*    (2006.01)
(52) U.S. Cl. ...................... 365/148; 365/157
(58) Field of Classification Search .................. 365/148, 365/157, 163  
See application file for complete search history.

(56) References Cited

U.S. PATENT DOCUMENTS 6,225,133 B1    5/2001    Yamamichi et al.  
6,316,801 B1    11/2001    Amanuma  
(Continued)

FOREIGN PATENT DOCUMENTS

JP    7-74313    3/1995  
(Continued)

OTHER PUBLICATIONS

International Search Report issued Jul. 27, 2010 in corresponding International Application No. PCT/JP2010/003597.

*Primary Examiner* — Vu Le  
(74) *Attorney, Agent, or Firm* — Wenderoth, Lind & Ponack, L.L.P.

(57) ABSTRACT

A method of manufacturing a memory cell array in which first conductive layers (2) and second conductive layers (14) extend above a semiconductor substrate (1) and three-dimensionally cross with each other, and memory cells each of which includes a current steering element (10) and a variable resistance element (23) electrically connected in series to each other is provided at a corresponding one of three-dimensional cross points between the first conductive layers (2) and the second conductive layers (14). The method includes: forming a first interlayer insulating film (3); forming a contact hole in the interlayer insulating film (3); depositing a first plug material (4) in the contact hole and on the first interlayer insulating film (3); performing a first polishing in which the first plug material (4) is polished until the first interlayer insulating film (3) is exposed; depositing a conductive film (6a) that becomes a first electrode (6) of the current steering element (10), on the first plug material (4) and the first interlayer insulating film (3) after the first polishing; and performing a second polishing in which a surface of the conductive film (6a) is polished.

7 Claims, 13 Drawing Sheets

U.S. PATENT DOCUMENTS

| | | |
|---|---|---|
| 7,382,647 B1 | 6/2008 | Gopalakrishnan |
| 7,463,546 B2 * | 12/2008 | Fasoli et al. .............. 365/230.06 |
| 7,499,355 B2 * | 3/2009 | Scheuerlein et al. ......... 365/201 |
| 2001/0038115 A1 | 11/2001 | Amanuma |
| 2004/0202041 A1 | 10/2004 | Hidenori |
| 2007/0034924 A1 | 2/2007 | Takewaki et al. |
| 2008/0105878 A1 | 5/2008 | Ohara |
| 2009/0052225 A1 | 2/2009 | Morimoto |
| 2009/0309088 A1 | 12/2009 | Sakamoto |
| 2009/0321711 A1 | 12/2009 | Takagi et al. |
| 2010/0065807 A1 | 3/2010 | Takagi et al. |

FOREIGN PATENT DOCUMENTS

| | | |
|---|---|---|
| JP | 10-209394 | 8/1998 |
| JP | 11-111947 | 4/1999 |
| JP | 2002-100745 | 4/2002 |
| JP | 2004-319587 | 11/2004 |
| JP | 2006-203098 | 8/2006 |
| JP | 2007-49089 | 2/2007 |
| JP | 2008-118022 | 5/2008 |
| WO | 2005/124787 | 12/2005 |
| WO | 2008/001712 | 1/2008 |
| WO | 2008/047530 | 4/2008 |
| WO | 2008/062734 | 5/2008 |
| WO | 2008/104462 | 9/2008 |

* cited by examiner

Fig. 1
(a)
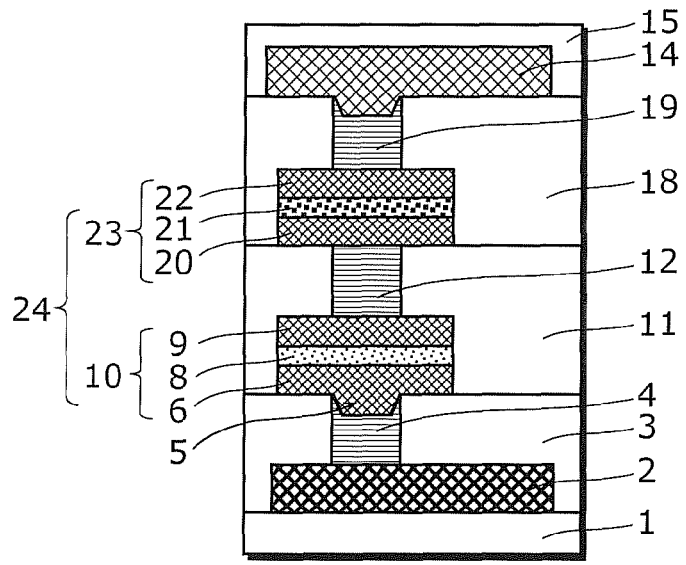
(b)
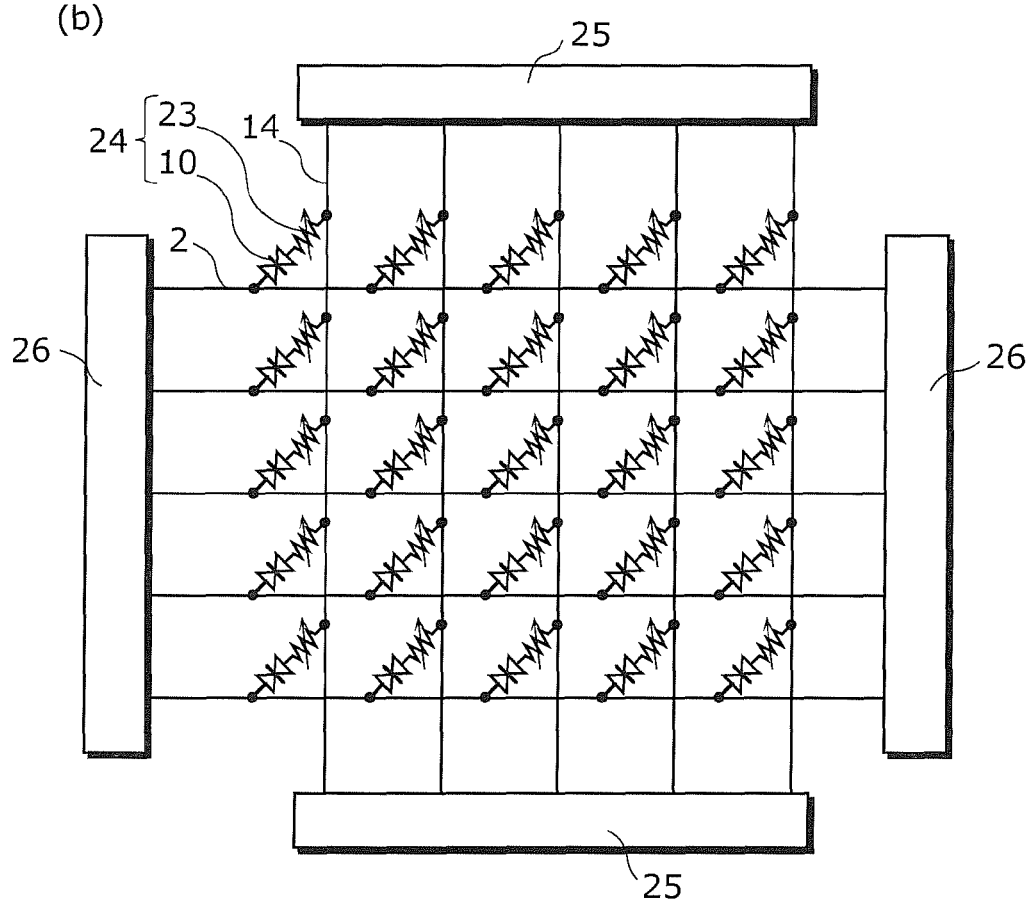

Fig. 2
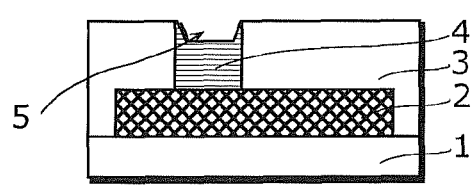
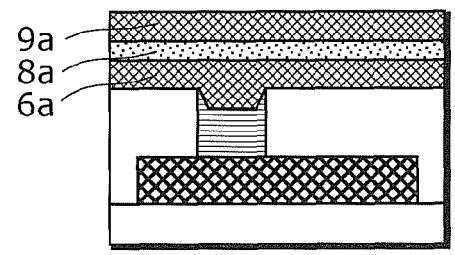
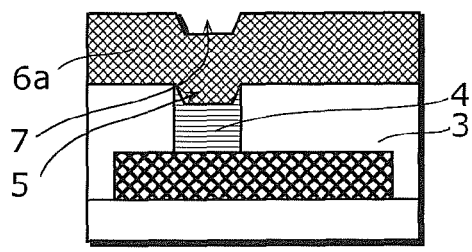
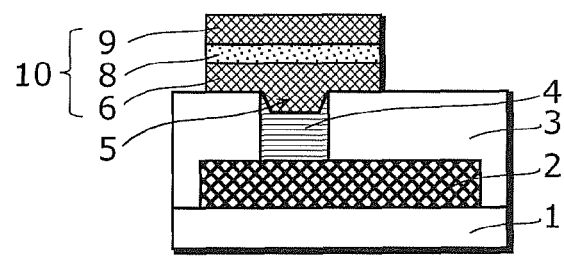
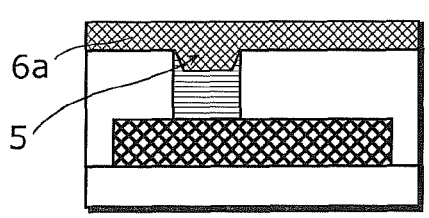
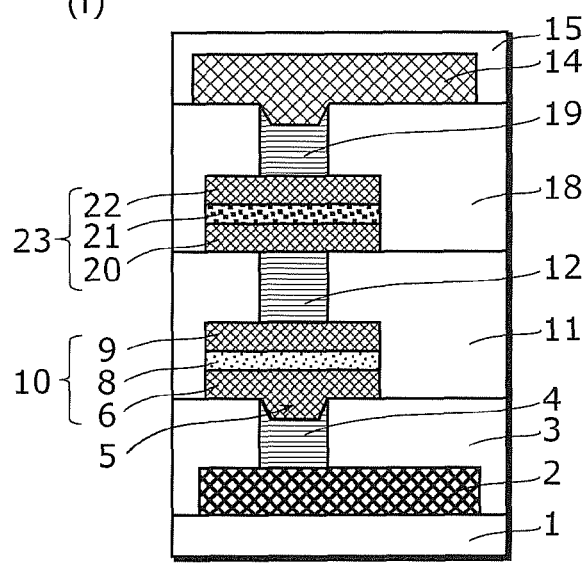

Fig. 7
(a)
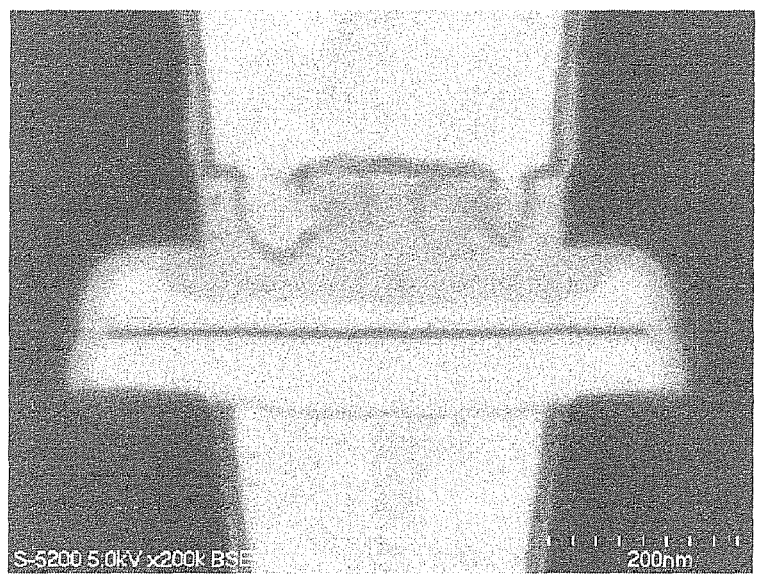
(b)
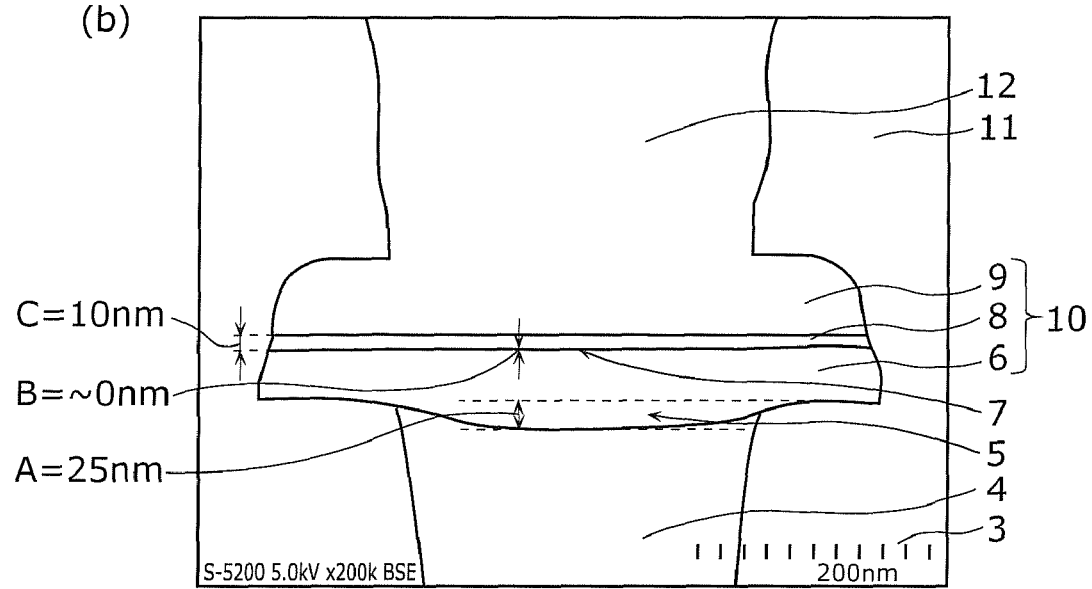

Fig. 8
(a)
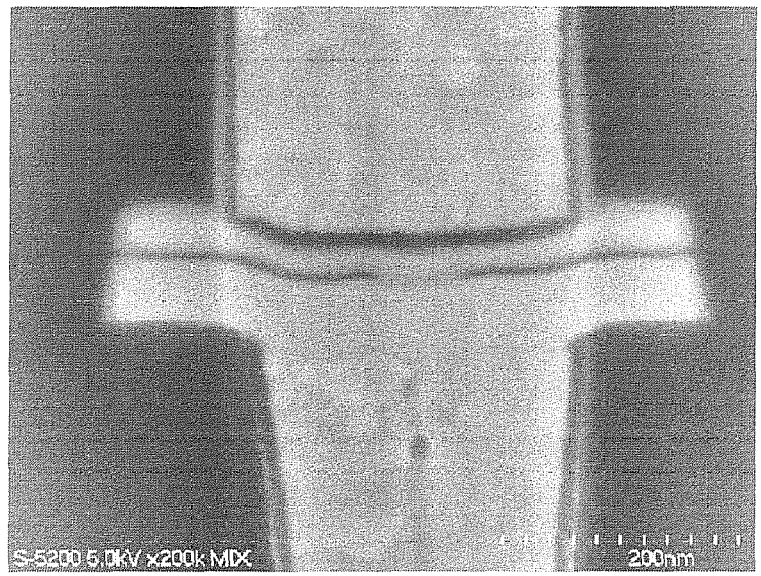
(b)
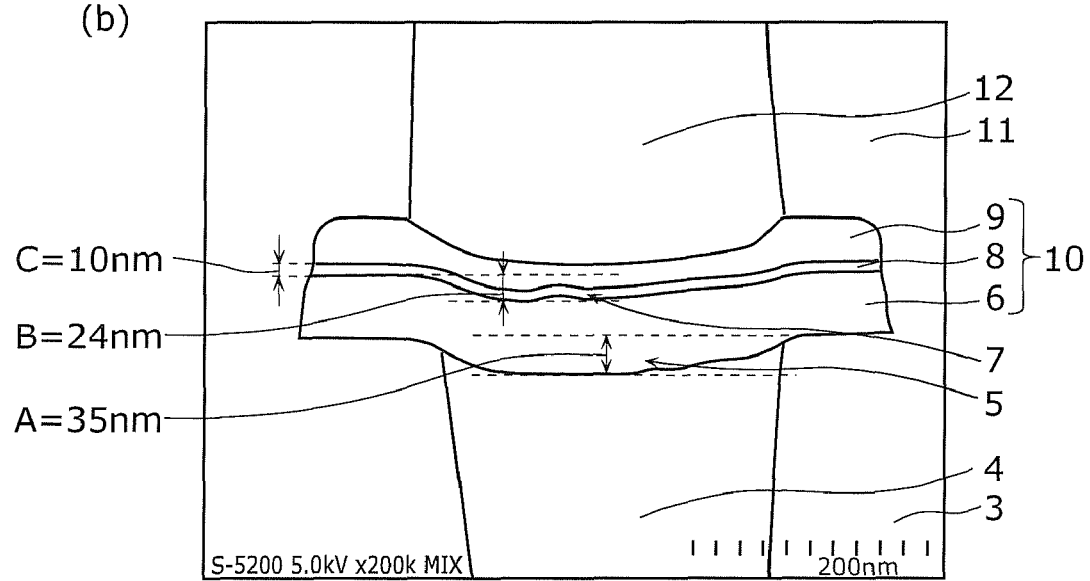

Fig. 10
(a)
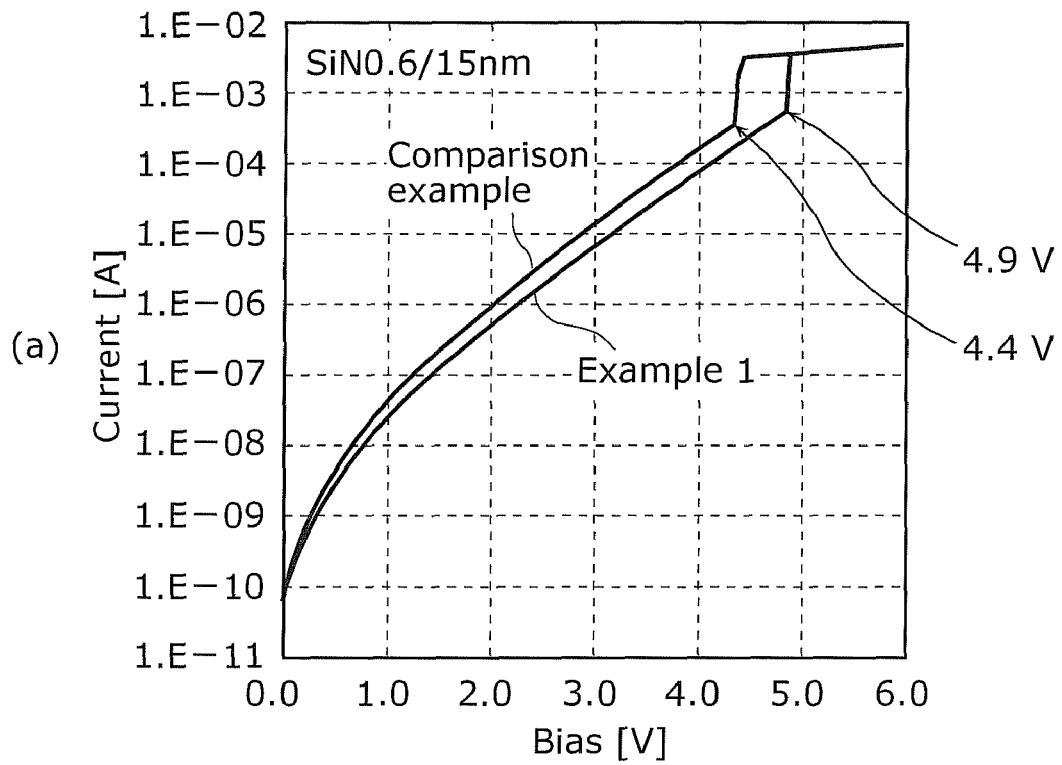
(b)
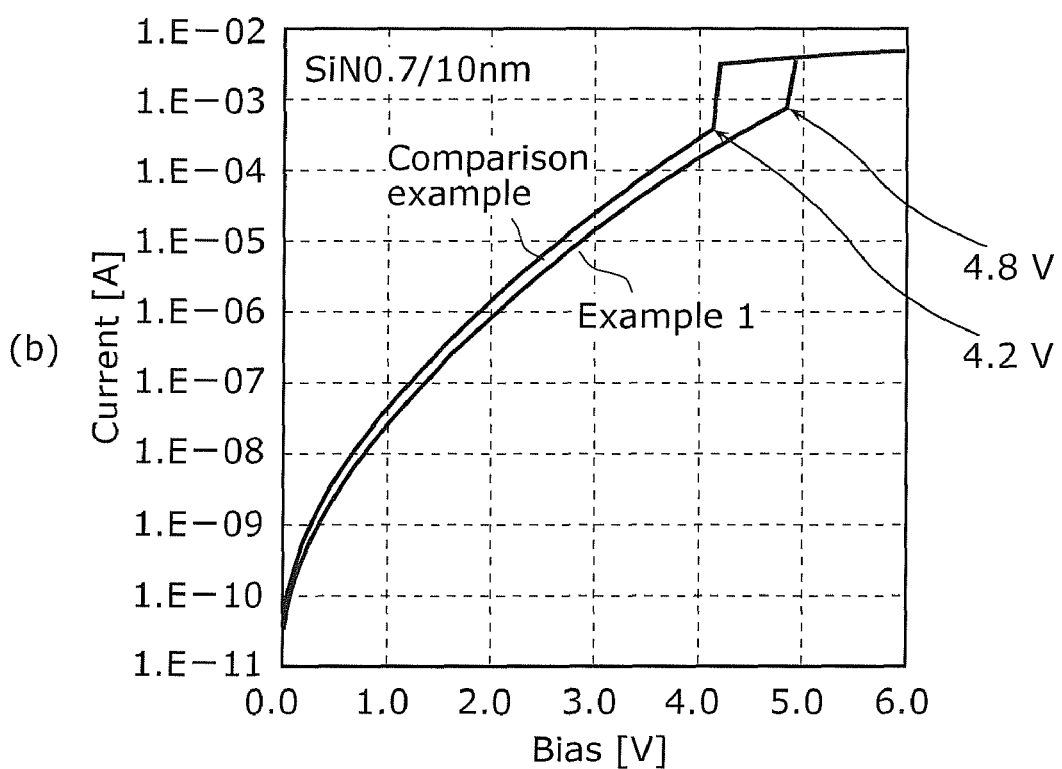

Fig. 13
(a)
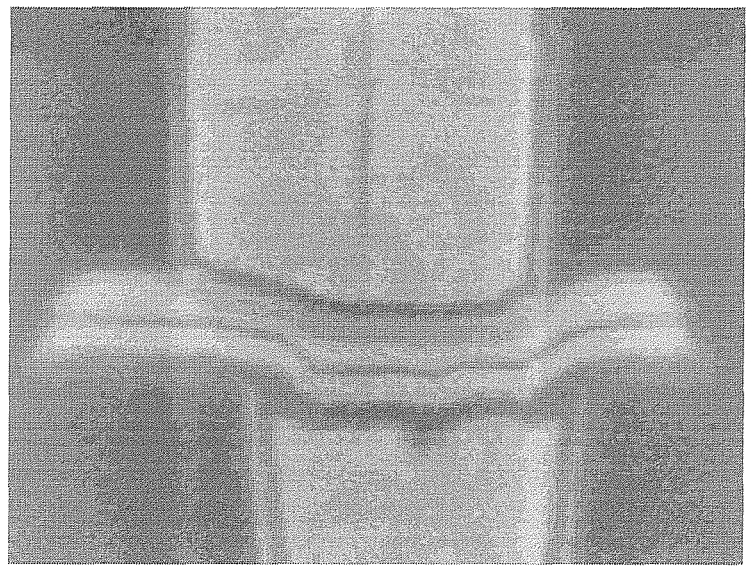
(b)
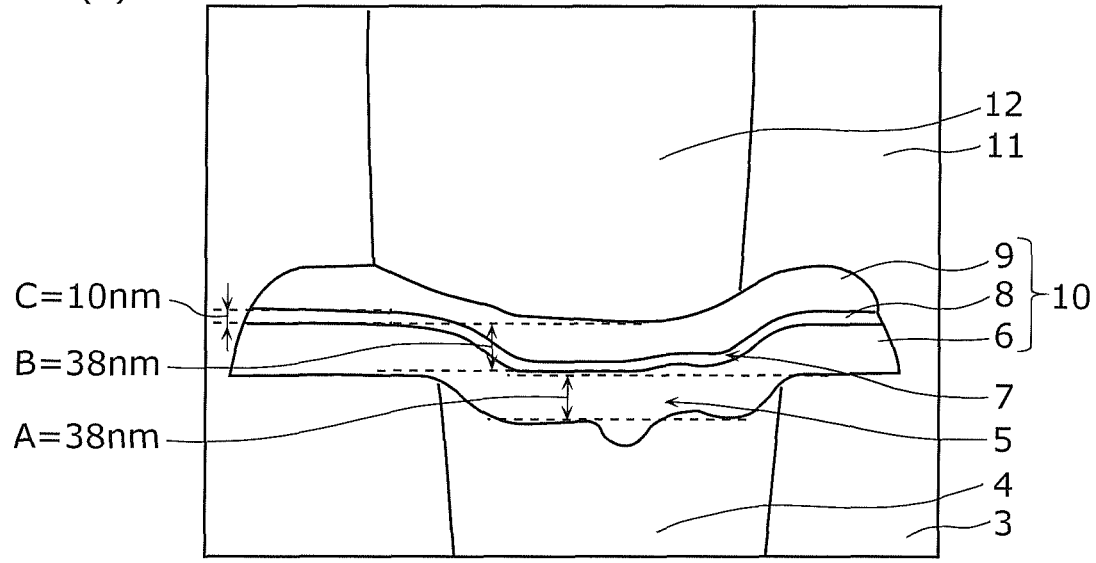

MEMORY CELL ARRAY, NONVOLATILE STORAGE DEVICE, MEMORY CELL, AND METHOD OF MANUFACTURING MEMORY CELL ARRAY

TECHNICAL FIELD

The present invention relates to a memory cell array and a manufacturing method of the same. The memory cell array includes, as a memory cell, a non-volatile storage element in which a variable resistance element and a current steering element are connected in series and the current steering element controls a current flowing through the variable resistance element.

BACKGROUND ART

In recent years, active researches have been conducted on variable resistance elements that store information using a storage function of a variable resistance layer.

The variable resistance layer used for the variable resistance element is a thin film including a material mainly made up of a metal oxide. A resistance value of the variable resistance layer changes in response to an application of a voltage pulse to the variable resistance layer, and a resultant resistance value is held in a nonvolatile manner. When a high resistance state and a low resistance state of the variable resistance layer correspond to binary data "1" and "0", respectively, the binary data can be stored in the variable resistance element.

The magnitude of a voltage applied to the variable resistance element for causing a resistance change or the magnitude of a current flowing according to the applied voltage are only necessary to be a degree sufficient to cause a physical state of the variable resistance layer to change and not to damage the variable resistance layer, and a voltage pulse of such a magnitude may be applied more than once.

A memory cell array of a so-called cross point type can be configured by providing a memory cell including the variable resistance element in corresponding one of three-dimensional cross points of a plurality of word lines and a plurality of bit lines.

It is known that, with the cross point memory cell array, when data is written into a selected memory cell (selected cell) or data is read from a variable resistance element, a disorder which is called a write-disturb or a read-disturb may occur, by which data of a memory cell that is not selected (non-selected cell) is caused to change due to an influence from a leak current flowing through the non-selected cell.

In view of the above, nonvolatile storage devices using a cross point memory cell array are generally configured such that the write-disturb and the read-disturb can be prevented.

A non-volatile store device including a memory cell array in which memory cells including a serial circuit of a variable resistance element and a diode (a current steering element) are arranged in a matrix has been proposed as an example of a nonvolatile storage device which is capable of suppressing the occurrence of the read-disturb using a cross point memory cell array (see PTL 1, for example).

The non-volatile storage device disclosed by PTL 1 includes a memory cell array which uses, as a memory cell, a non-volatile storage element including a variable resistance element and a diode connected to each other in series, and each of the ends of the memory cell is connected to a corresponding one of a word line and a bit line.

Data is read from a selected cell via the word line and the bit line to which the selected cell is connected, by applying a predetermined reading voltage (a voltage equal to or greater than an on-voltage of the diode) to the selected cell.

A voltage intermediate between a voltage applied to the word line to which the selected cell is connected and a voltage applied to the bit line is applied to a word line and a bit line which are not connected to the selected cell. More specifically, approximately half a reading voltage is applied to a non-selected cell (a half selected cell) connected to the word line or the bit line to which the selected cell is also connected.

Thus, when the reading voltage is set at a value smaller than twice the on-voltage of the diode, a voltage applied to the half selected cell is smaller than the on-voltage of the diode, and thus a leak current from the half selected cell is suppressed to a minute level due to a nonlinear voltage current characteristic of the diode. This prevents the read-disturb.

CITATION LIST

Patent Literature

[PTL 1]
Japanese Unexamined Patent Application Publication No. 2004-319587

SUMMARY OF INVENTION

Technical Problem

However, with the cross point nonvolatile storage device configured as above has a problem as below.

When data is read from the selected cell, since a voltage approximately half a reading voltage is applied to a plurality of non-selected cells (half selected cells, for example), a leak current of a minute level corresponding to the nonlinear voltage current characteristics of the diode flows. Thus, with the cross point memory cell array, a leak current, despite a minute level, from the non-selected cell cannot be completely eliminated.

Therefore, the leak current increases as the size of the memory cell array (a matrix size) increases and the number of the non-selected cells increases, and eventually reaches the size that prevents the operation of reading data from the selected cell. This indicates that the maximum matrix size is restricted according to electric characteristics (the magnitude of the leak current, in particular) of the diode.

A large-capacity nonvolatile storage device is configured by, in general, disposing on a semiconductor substrate, a plurality of units including a memory cell array having an area according to the matrix size and a peripheral circuit that requires a fixed area irrespective of the matrix size for driving the memory cell array.

Thus, when the matrix size of the memory cell array cannot be increased because the leak current of the diode is large, it is inevitable that the ratio of the area of the peripheral circuit to the area of the memory cell array becomes relatively great. As a result, the nonvolatile storage device cannot be highly integrated.

The present invention presents a solution to the above-stated conventional problems and aims to provide a preferable configuration for reducing a leak current of a current steering element in a memory cell array including, as a memory cell, a non-volatile storage element in which a variable resistance element and the current steering element that controls a current flowing through the variable resistance element are connected to each other in series, and a manufacturing method of the memory cell array having such a configuration.

Solution to Problem

In order to solve the above problems, a memory cell array according to an aspect of the present invention is a memory cell array comprising: a semiconductor substrate; first conductive layers arranged to extend in parallel to each other on the semiconductor substrate; an interlayer insulating film formed to cover the first conductive layers; second conductive layers arranged above the interlayer insulating film to extend in parallel to each other and to three-dimensionally cross with the first conductive layers; plugs each formed to penetrate through the interlayer insulating film and to have a lower surface electrically connected to a corresponding one of the first conductive layers at a corresponding one of three-dimensional cross points between the first conductive layers and the second conductive layers; and memory cells each formed between, and electrically connected to, an upper surface of a corresponding one of the plugs and a corresponding one of the second conductive layers, at the corresponding one of three-dimensional cross points between the first conductive layers and the second conductive layers, wherein each of the memory cells includes: a current steering element formed to cover the upper surface of the corresponding one of the plugs, the current steering element having a nonlinear current-voltage characteristic, and a variable resistance element which is electrically connected in series to the current steering element and has a resistance value that reversibly changes in response to an application of a voltage pulse, the upper surface of each of the plugs is formed to have a first concave shape, the current steering element includes: a first electrode that covers the upper surface of the corresponding one of the plugs; a current steering layer formed on the first electrode; and a second electrode formed on the current steering layer, and the first electrode is thicker above a center portion than above a peripheral portion of the upper surface of the corresponding one of the plugs, by a maximum of a depth of the first concave shape.

With such a configuration, since the first electrode is formed to have a characteristic shape with which the thickness of the first electrode above the center portion of the upper surface of the plug is larger than the thickness of the first electrode above the peripheral portion of the upper surface of the plug, by up to the depth of the first concave shape, a level difference generated due to the first concave shape is reduced or eliminated at the upper surface of the first electrode. The upper surface of the first electrode has a shape of a second concave shape that is shallower than the first concave shape, or a shape that is substantially flat.

Since the current steering layer is formed on the first electrode in which the level difference is reduced or eliminated, the current steering layer is less likely to be locally excessively thin. As a result, the possibility of occurrence of a leak path in a current steering element is reduced, so that it is possible to prevent deterioration of the electric characteristics of the current steering element, such as an increase in a leak current and a decrease in a breakdown voltage.

Since the current steering element having better electric characteristics (with a smaller leak current, in particular) can be obtained, it is possible to facilitate enlargement of a matrix size in a memory cell array in which memory cells including such a current steering element are arranged in a matrix.

As described above, when the matrix size can be enlarged, it is possible to reduce the ratio of an area of a peripheral circuit to an area of the memory cell array, thereby facilitating further integration for implementing a large-capacity nonvolatile storage device.

Furthermore, it is preferable that the first electrode has an upper surface having a second concave shape above the upper surface of the corresponding one of the plugs, and the second concave shape may have a depth smaller than a thickness of the current steering layer.

In addition, it is further preferable that the first electrode has an upper surface formed substantially flat above the upper surface of the corresponding one of the plugs.

Since the above configuration further strengthen the advantageous effect of which the thickness of the current steering layer less is likely to be locally excessively thin, the possibility of occurrence of a leak path is further reduced, so that it can be expected that a leak current of the current steering element can further be reduced.

Furthermore, in the memory cell array according to another aspect of the present invention, the variable resistance element includes: a variable resistance layer formed in contact with the second electrode of the current steering element; and a third electrode formed on the variable resistance layer, the second electrode, the variable resistance layer, and the third electrode forming a stacked structure that functions as the variable resistance element.

With such a configuration, the current steering element and the variable resistance element are integrally formed, and thus it is possible to omit the second plug that is necessary in the case where the current steering element and the variable resistance element are individually formed. The omission of the second plug reduces parasitic capacitance and thus causes less signal delay, thereby implementing a high-speed operation. In addition, since it is not necessary to form the second plug, it is possible to simplify the manufacturing method, thereby producing an advantageous effect of a reduction in manufacturing costs.

Furthermore, in the memory cell array according to yet another aspect of the present invention, the first electrode or the second electrode may include tantalum nitride and the current steering layer may include silicon nitride.

With this configuration, it is possible to implement the current steering element that has a large on-state current, a small off-state current, and a high breakdown voltage.

Furthermore, a method of manufacturing a memory cell array according to an aspect of the present invention is a method of manufacturing a memory cell array in which first conductive layers and second conductive layers extend above a semiconductor substrate and three-dimensionally cross with each other, and a memory cell is provided at a corresponding one of three-dimensional cross points between the first conductive layers and the second conductive layers, each of the memory cells including: a current steering element that includes a first electrode, a current steering layer formed on the first electrode, and a second electrode formed on the current steering layer, the current steering element having a nonlinear current-voltage characteristic; and a variable resistance element which is electrically connected in series to the current steering element and has a resistance value that reversibly changes in response to an application of a voltage pulse, the method comprising: forming the first conductive layers on the semiconductor substrate; forming an interlayer insulating film to cover the first conductive layers; forming a contact hole in the interlayer insulating film at a position corresponding to each of the memory cells such that the contact hole penetrates through the interlayer insulating film to reach the first conductive layer; depositing a plug material in the contact hole and on the interlayer insulating film; performing a first polishing in which the plug material is polished until the interlayer insulating film is exposed; depositing a conductive film that becomes the first electrode of the current steering element, on the plug material and the interlayer insulating film, after the first polishing; and performing a second polishing in which a surface of the conductive film is polished.

With such a method, since the upper surface of the plug material is formed to have a concave shape in the first polishing process, a level difference in which the concave shape is transferred is once formed on the upper surface of the conductive film, and then the level difference on the upper surface of the conductive film is reduced or eliminated in the second polishing process.

As a result, since the current steering layer of the current steering element is formed on the conductive film in which the level difference is reduced or eliminated, the thickness of the current steering layer less is likely to be locally excessively thin, and thus an occurrence of a leak path can be prevented and a leak current of the current steering element can be reduced.

Furthermore, it is preferable that, in the performing of a second polishing, the surface of the conductive film is polished using chemical mechanical polishing.

With this, the upper surface of the first electrode is polished using chemical mechanical polishing, and thus it is possible to reduce the depth of the second concave portion and form the upper surface of the first electrode to be substantially flat.

The present invention can be implemented not only as a memory cell array and a manufacturing method of the memory cell array described above but also as a nonvolatile storage device that includes the memory cell array, and as a memory cell included in the memory cell array.

Advantageous Effects of Invention

In the memory cell array according to an aspect of the present invention, a variable resistance element in each of the memory cells is formed on a plug that has a surface having a first concave shape exposed to a surface of an interlayer insulating film, and a first electrode included in the variable resistance element has a characteristic shape with which the thickness of the first electrode above a center portion of the upper surface of the plug is larger than the thickness of the first electrode above a peripheral portion of the upper surface of the plug, by up to the depth of the first concave shape.

Thus, a level difference generated due to the first concave shape is reduced or eliminated at the upper surface of the first electrode. The upper surface of the first electrode has a shape of a second concave shape that is shallower than the first concave shape, or a shape that is substantially flat.

Since the current steering layer is formed on the first electrode in which the level difference is reduced or eliminated, the current steering layer is less likely to be locally excessively thin. As a result, the possibility of occurrence of a leak path in a current steering element is reduced, so that it is possible to prevent deterioration of the electric characteristics of the current steering element, such as an increase in a leak current and a decrease in a breakdown voltage.

Since the current steering element having better electric characteristics (with a smaller leak current, in particular) can be obtained, it is possible to facilitate enlargement of a matrix size in a memory cell array in which memory cells including such a current steering element are arranged in a matrix. When the matrix size can be enlarged, it is possible to relatively reduce the ratio of an area of the peripheral circuit to an area of the memory cell array, so that further integration for implementing a large-capacity nonvolatile storage device is facilitated.

BRIEF DESCRIPTION OF DRAWINGS

FIG. 1(a) is a schematic cross-sectional diagram which shows an example of a configuration of a memory cell used for a memory cell array according to Embodiment 1 of the present invention. FIG. 1(b) is a block diagram which shows an example of a functional configuration of a nonvolatile storage device according to Embodiment 1 of the present invention.

FIG. 2(a) to (f) illustrates sectional views in processing which show an example of a manufacturing method of a memory cell according to Embodiment 1 of the present invention

FIG. 7(a) is an SEM photomicrographs of a cross-sectional view of the current steering element according to an example 1 and FIG. 7(b) is a cross-sectional view of the schematic diagram.

FIG. 8(a) is an SEM photomicrographs of a cross-sectional view of the current steering element according to an example 2 and FIG. 8(b) is a cross-sectional view of the schematic diagram.

FIGS. 10(a) and (b) illustrates graphs which show breakdown characteristics of the current steering element according to each of the comparison example and the example 1.

FIG. 13(a) is an SEM photomicrographs of a cross-sectional view of the current steering element according to the comparison example and FIG. 13(b) is a cross-sectional view of the schematic diagram.

DESCRIPTION OF EMBODIMENTS

Examination of a Problem Using a Comparison Example

In order to examine in detail the problems described above, the inventors of the present invention manufactured a plurality of current steering elements as comparison examples and measured the electric characteristics (a leak current, in particular). The current steering elements according to the comparison example are manufactured according to a conventional manufacturing method described below.

A leak current of the current steering elements according to the comparison example varies among samples, and a typical leak current was 2.76 µA/µm². Here, the leak current is defined as a current which flows when a voltage $V_{off}$ that is half a voltage $V_{on}$ necessary to provide the current steering element with a desired on-current $I_{on}$.

Calculation of a maximum matrix size, with which a normal performance is possible, of a memory cell array using, as a memory cell, a non-volatile storage element including a current steering element and a variable resistance element of the comparison example, based on a value of a measured leak current, found that the upper limit was 16 cells (4 cells×4 cells).

With the current steering element of the comparison example which is manufactured with a conventional manufacturing method, only a memory cell array having a small matrix size can be configured, and thus it is apparent that the nonvolatile storage device cannot be further integrated.

The inventors of the present invention speculated about the cause for a large leak current in the current steering element of the comparison example as below. The following describes the above with reference to FIG. 11 to FIG. 13.

Figure 11:
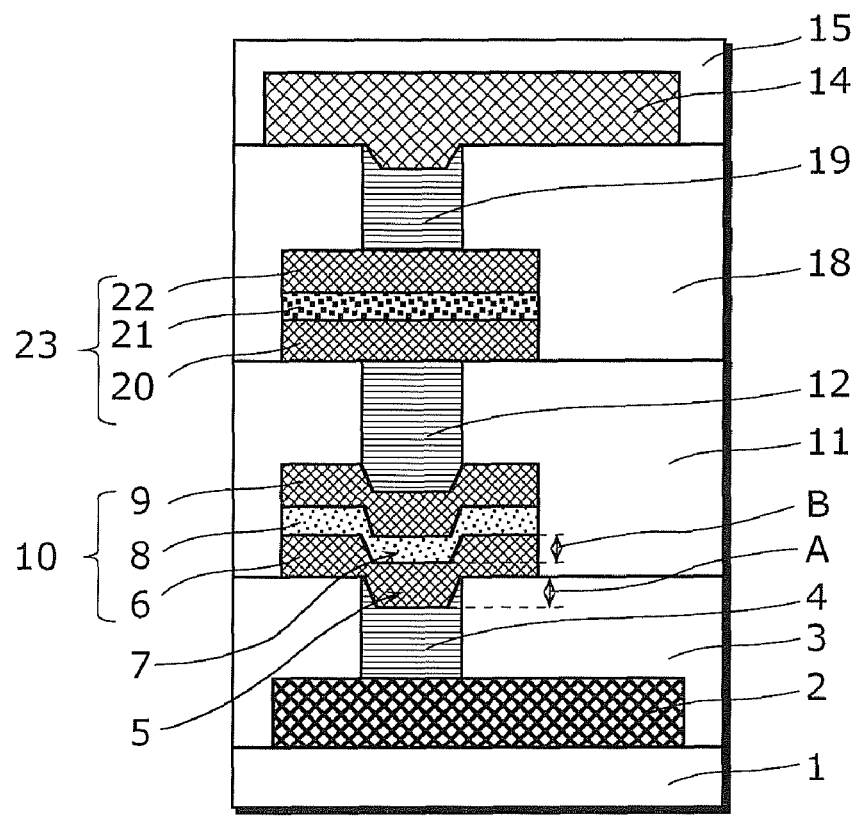
FIG. 11 is a schematic diagram which shows an example of a configuration of a non-volatile storage element according to the comparison example.
Figure 12:
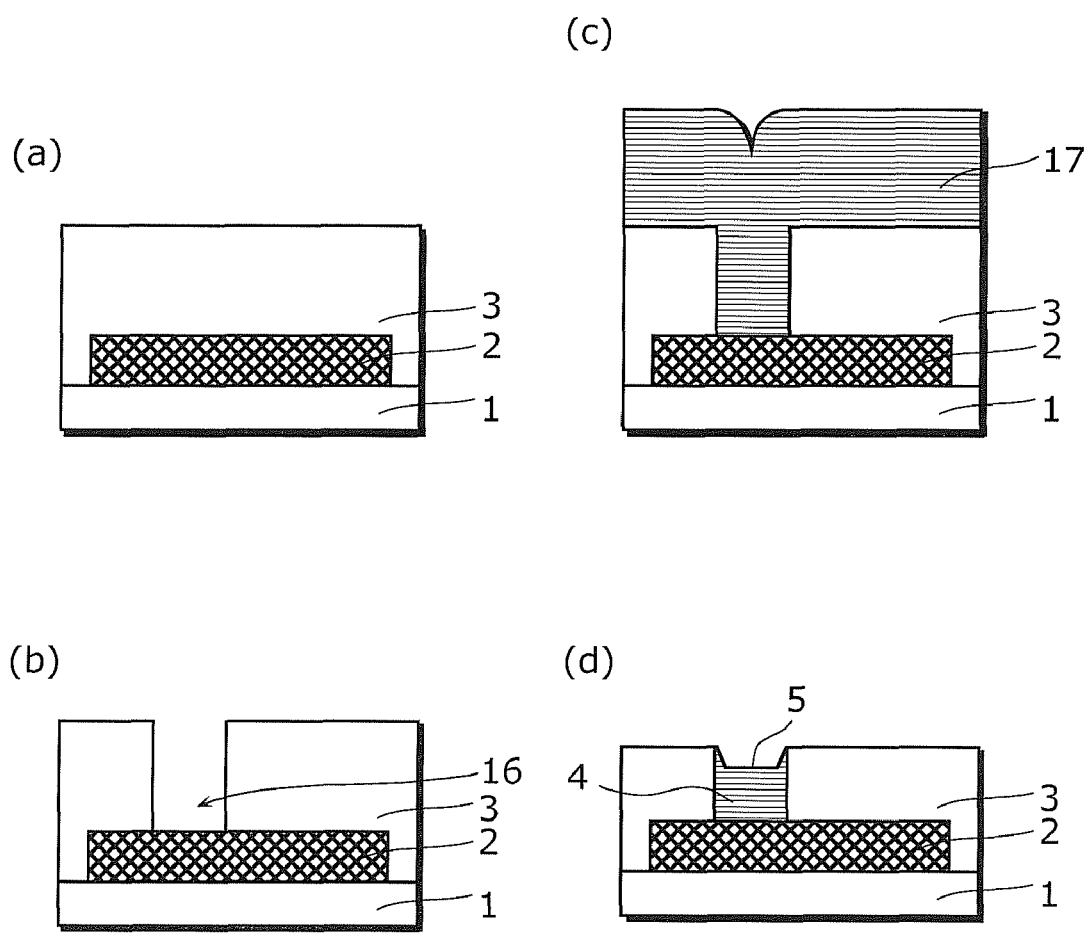
FIG. 12(a) to (d) illustrates cross-sectional views in processing which show an example of a manufacturing method of the current steering element according to the comparison example.

FIG. 11 is a schematic diagram which shows an example of a configuration of a non-volatile storage element including a current steering element 10 of the comparison example.

The non-volatile storage element shown in FIG. 11 includes: a semiconductor substrate 1; a first conductive layer 2 formed on the semiconductor substrate 1; a first interlayer insulating film 3 formed on the first conductive layer 2. A first plug 4 of a conductive type is formed in the first interlayer insulating film 3 so as to penetrate through the first interlayer insulating film 3 to reach the first conductive layer 2, and a current steering element 10 is formed on the upper surface of the first plug 4 and on the first interlayer insulating film 3.

The current steering element 10 includes: a first electrode 6; a second electrode 9; a current steering layer 8 that is a semiconductor layer or an insulation layer formed between the first electrode 6 and the second electrode 9. A second conductive layer 14 is formed above the current steering element 10, and a variable resistance element 23 is formed between the second conductive layer 14 and the current steering element 10.

Each of the layers in the current steering element 10 is formed so as to have a center portion concave toward the semiconductor substrate 1 to an equal degree. The first plug 4 is formed to have a concave upper surface to form a first concave portion 5. The first electrode 6 is formed to have a concave upper surface at a position above the first plug 4 to form a second concave portion 7. A depth of each of the first concave portion and the second concave portion is 10 to 40 nm, which is substantially the same among any samples manufactured on the semiconductor substrate 1.

It is to be noted that the notation of the range of dimensions indicates a variation among the samples manufactured by way of trial on the semiconductor substrate (so-called an in-plate variation) and that each of the samples has definite dimensions. In the description below, the in-plate variation is denoted in the same manner.

Here, it is defined that the depth of the first concave portion 5 is a level difference, in a direction perpendicular to the substrate, between a lowest point of the upper surface of the first plug 4 and a highest point at a boundary between the first plug 4 and the first interlayer insulating film 3 (A in FIG. 11). In addition, it is defined that the depth of the second concave portion 7 is a level difference, in a direction perpendicular to the substrate, between a lowest point and a highest point of the upper surface of the first electrode 6 in a region immediately above the upper surface of the first plug 4 (B in FIG. 11).

The following describes a conventional manufacturing method employed for manufacturing a current steering element of the comparison example.

FIG. 12(a) to (b) illustrates cross-sectional views in processing which show an example of the manufacturing method of the current steering element of the comparison example.

First, in the process shown by FIG. 12(a), the first conductive layer 2 is formed on the semiconductor substrate 1 and the first interlayer insulating film 3 is formed on the semiconductor substrate 1 to cover the first conductive layer 2. Then, a resist film having a predetermined pattern (not illustrated) is formed by a general exposure process and development process as shown in FIG. 12(b), and a contact hole 16 is formed which reaches the first conductive layer 2, by using the resist film as a mask.

Next, in the process shown by FIG. 12(a), a plug material 17 which is a conductive material to be the first plug 4 is buried in the contact hole 16 and, at the same time, deposited on the first interlayer insulating film 3, using chemical vapor deposition (CVD) or sputtering.

Next, in the process shown by FIG. 12(d), the plug material 17 formed on the first interlayer insulating film 3 is polished using chemical mechanical polishing (CMP) or etch back. In this polishing, the plug material 17 is polished until the upper surface of the first interlayer insulating film 3 is exposed so that a residue of the plug material 17 does not remain on the upper surface of the first interlayer insulating film 3. The plug material 17 buried in the contact hole 16 becomes the first plug 4.

In this processing, a local level difference is generated between the upper surface of the first plug 4 buried in the contact hole 16 and the upper surface of the first interlayer insulating film 3, so that the first concave portion 5 is formed. The reason for the formation of the first concave portion 5 is that a polishing rate for the plug material 17 is higher than a polishing rate of the first interlayer insulating film 3.

Next, a conductive film that becomes the first electrode 6, a semiconductor film or an insulation film that becomes the current steering layer 8, and a conductive film that becomes the second electrode 9 are deposited above the first concave portion 5 in this order, and then patterning is carried out using a known process such as photolithography (not illustrated). As a result, the current steering element 10 is formed in a region above the first concave portion 5 as shown in FIG. 11.

At this time, since the first electrode 6, the current steering layer 8, and the second electrode 9 are sequentially stacked above the first concave portion 5, the concave shape in the upper surface of the first plug 4 is transferred to the upper surface of the first electrode 6 positioned immediately above the first concave portion 5 as shown in FIG. 11, so that the second concave portion 7 having a shape substantially the same as the shape of the first concave portion 5 is formed. In addition, each of the current steering layer 8 and the second electrode 9 is deposited to have a uniform thickness above the second concave portion 7, so that a concave portion having a shape substantially the same shape as the second concave portion 7 is formed. As a result, each of the layers in the current steering element 10 is formed so as to include a concave with substantially the same depth.

The manufacturing method used for manufacturing the current steering element of the comparison example has been described above, and this is an example of the method conventionally used for manufacturing semiconductor devices.

Then, a second interlayer insulating film 11 that covers the current steering element 10 and a second plug 12 are formed, and the variable resistance element 23 including: a lower electrode 20; a variable resistance layer 21; and an upper electrode 22, a third interlayer insulating film 18, a third plug 19, a second conductive layer 14, and a passivation film 15 are formed, thereby making the non-volatile storage element as shown in FIG. 11.

A cross-sectional observation was carried out for a sample manufactured for the current steering element 10 of the comparison example.

FIG. 13(a) is a scanning electron microscope (SEM) photomicrograph of a cross-sectional view of the current steering element 10 of the comparison example and FIG. 13(b) is a cross-sectional view of a schematic diagram thereof. The same numeral of each of the structural elements in FIG. 11 is attached to a corresponding one of the structural elements of the current steering element 10, and the description therefore is omitted.

As shown in FIGS. 13(a) and (b), the current steering element 10 is formed on the first interlayer insulating film 3 including the first plug 4. The first concave portion 5 is formed in the upper surface of the first plug 4, and the second concave portion 7 is formed in the upper surface of the first electrode 6. Here, the depth A of the first concave portion is 38 nm, the depth B of the second concave portion is 38 nm, and the film thickness C of the current steering layer 8 is 10 nm.

The inventors of the present invention speculated, as below, about the reason why the leak current is often caused in the current steering element 10 of the comparison example, in view of the shape of the current steering element 10 of the comparison example as shown in FIGS. 13(a) and (b).

According to the manufacturing method used for manufacturing the current steering element 10 of the comparison example, a level difference is generated between the upper surface of the first interlayer insulating film 3 and the upper surface of the first plug 4, so that the first concave portion 5 is formed in the upper surface of the first plug 4. When the current steering element 10 is formed on the first concave portion 5, the current steering element 10 is formed into the shape to which the shape of the first concave portion 5 is transferred, as described above.

Here, the film thickness C of the current steering layer 8 included in the current steering element 10 is small, ranging from 5 nm to 30 nm depending on the samples, and an excessive decrease in a resistance value or a short circuit can be caused in the case where a locally thinner portion is included in the current steering layer 8. In addition, in the sample shown in FIG. 13(b), the film thickness C of the current steering layer 8 measures only 10 nm, which is thinner than the depth B of the second concave portion 7 which measures 38 nm, so that a disconnection caused by the level difference can occur in the current steering layer 8.

As described above, it is speculated that there is a high possibility that an increased leak current or a variation among the samples is caused by the concave shape of the current steering element 10 as a result of transferring of the concave shape of the upper surface of the first plug 4 to the shapes of the first electrode 6 and the current steering layer 8.

The inventors of the present invention devised, in view of the speculation described above, improving the electric characteristics of the current steering element by reducing or eliminating the concave of the current steering layer 8, a memory cell array using such a current steering element, and a manufacturing method of the memory cell array.

Thus, in the current steering element according to an aspect of the present invention, the first electrode 6 is formed to have a characteristic shape with which the thickness of the first electrode 6 above the center portion of the upper surface of the first plug 4 is larger than the thickness of the first electrode 6 above a peripheral portion of the upper surface of the first plug 4, by up to the depth of the concave shape in the upper surface of the first plug 4. With this, the level difference generated by the concave shape of the upper surface of the first plug 4 is reduced or eliminated on the upper surface of the first electrode 6, and thus the concave of the current steering layer 8 is reduced or eliminated as well.

The following is a detailed description of embodiments according to the present invention.

Embodiment 1

The following describes, with reference to FIG. 1 and FIG. 2, a memory cell array which uses as a memory cell, a non-volatile storage element including a current steering element and a variable resistance element connected to each other in series, and a method of manufacturing the memory cell array, according to Embodiment 1 of the present invention.

FIG. 1(a) is a schematic cross-sectional diagram which shows an example of a configuration of a memory cell used for a memory cell array according to Embodiment 1 of the present invention. FIG. 1(b) is a block diagram which shows an example of a functional configuration of a nonvolatile storage device using the memory cell array in which the memory cells are arranged in a matrix.

The memory cell according to Embodiment 1 is formed on a semiconductor substrate 1 as shown in FIG. 1(a). The semiconductor substrate 1 is formed using a silicon substrate, for example. A first conductive layer 2 is formed on the semiconductor substrate 1 and a first interlayer insulating film 3 is formed to cover the surface of the semiconductor substrate 1 and the first conductive layer 2. The first interlayer insulating film 3 is formed using a silicon oxide film, for example.

A current steering element 10 is formed on the first interlayer insulating film 3. More specifically, a first electrode 6 is formed on the first interlayer insulating film 3, a current steering layer 8 is formed on the first electrode 6, and a second electrode 9 is formed on the current steering layer 8.

The first electrode 6 and the second electrode 9 are formed using tantalum nitride having conductivity, for example. The current steering layer 8 is formed using silicon nitride, silicon oxide, tantalum oxide, or the like, for example. In particular, it is possible to embody a large on-state current, a small off-state current, and a high breakdown voltage, by forming the first electrode 6 or the second electrode 9 using the tantalum nitride, and by forming the current steering layer 8 using the silicon nitride.

The first electrode 6 is formed to have an upper surface that is substantially flat. Here, the case where the upper surface is substantially flat also includes the case where, even when the surface is not parallel to the substrate, the surface is seamless without an inflection point and the difference between the highest point and the lowest point is less than 5 nm. The current steering layer 8 is formed on the substantially flat upper surface of the first electrode 6 to have a substantially uniform thickness of 5 to 30 nm. The thickness of the first electrode 6 (the thickness at a portion not immediately above the first plug 4) is 20 to 100 nm, the thickness of the second electrode 9 is 20 to 100 nm.

Furthermore, the first plug 4 is formed to penetrate through the first interlayer insulating film 3, and the first electrode 6 and the first conductive layer 2 are electrically connected to each other by the first plug 4.

The upper surface of the first plug 4 contacts with the first electrode 6 and has a concave shape toward the semiconductor substrate 1. This concave is called a first concave portion 5. The first concave portion 5 has a depth of 10 to 40 nm.

Furthermore, a second interlayer insulating film 11 is formed to cover the current steering element 10 and the first interlayer insulating film 3, and a second plug 12 is formed to penetrate through the second interlayer insulating film 11. Then, a variable resistance element 23 is formed on the second plug 12 and the second interlayer insulating film 11.

The variable resistance element 23 includes a lower electrode 20, an upper electrode 22, and a variable resistance layer 21 formed between the lower electrode 20 the upper electrode 22. The lower electrode 20 and the upper electrode 22 are formed using a metal such as Pt, Ir, W, Cu, TaN, or the like. The variable resistance layer 21 is formed using an oxygen-deficient transition metal oxide layer, such as an oxygen-deficient tantalum oxide ($TaO_x$), an oxygen-deficient hafnium oxide ($HfO_x$), an oxygen-deficient zirconium oxide ($ZrO_x$), for example. Here, the oxygen-deficient type transition metal oxide refers to a transition metal oxide having an oxygen content percentage lower than an oxygen content percentage of a transition metal oxide having a stoichiometric composition.

The lower electrode 20 of the variable resistance element 23 and the second electrode 9 of the current steering element 10 are connected to each other by the second plug 12 that penetrates through the second interlayer insulating film 11.

Furthermore, a third interlayer insulating film 18 is formed to cover the variable resistance element 23 and the second interlayer insulating film 11. A second conductive layer 14 is formed above the third interlayer insulating film 18. The second conductive layer 14 and the upper electrode 22 of the variable resistance element 23 are connected to each other by a third plug 19 formed to penetrate through the third interlayer insulating film 18. The second conductive layer 14 and the third interlayer insulating film 18 are covered by a passivation film 15.

It is to be noted that the variable resistance element 23 may be formed under the current steering element 10, that is, between the first electrode 6 and the first conductive layer 2. The variable resistance element 23 may be formed between the first plug 4 and the first conductive layer 2 in a contact hole in which the first plug 4 is formed, for example.

As shown in FIG. 1(b), the nonvolatile storage device according to Embodiment 1 is a typical example of a non-volatile storage device of a cross point type, and includes: first conductive layers 2 as word lines; second conductive layers 14 as bit lines; and memory cells 24 above the semiconductor substrate. Each of the first conductive layers 2 extends to three-dimensionally crosses with a corresponding one of the second conductive layers 14. Each of the memory cells 24 is disposed at a corresponding one of three-dimensional cross points between the first conductive layers 2 and the second conductive layers 14.

Each of the memory cells 24 is a non-volatile storage element including the variable resistance element 23 and the current steering element 10 electrically connected to each other in series. The memory cell shown in FIG. 1(a) is used for the memory cell 24. Each of the variable resistance elements 23 and each of the current steering elements 10 are illustrated by symbols of a variable resistance and a bidirectional diode, respectively.

Each of the first conductive layers 2 is commonly connected to memory cells 24 aligned in a lateral direction, functions as a word line, and is connected to a decoder 25, a not-illustrated read circuit, and a not-illustrated write circuit. The read circuit and the write circuit may be included in the decoder 25. Each of the second conductive layers 14 is commonly connected to memory cells 24 aligned in a vertical direction, functioned as a bit line, and is connected to a decoder 26.

A peripheral circuit including the decoder 25, the decoder 26, the read circuit, and a write circuit is formed using an active element including a metal oxide semiconductor field effect transistor (MOSFET), for example.

It is to be noted that the nonvolatile storage device according to the present invention is not limited to the case where the first conductive layers 2 and the second conductive layers 14 are used as the word lines and the bit lines, respectively. The cross point nonvolatile storage device may be formed using the first conductive layers 2 as the bit lines and the second conductive layers 14 as the word lines.

As described above, since the upper surface of the first electrode 6 in the current steering element 10 is formed substantially flat in the nonvolatile storage device according to Embodiment 1, the current steering layer 8 is less likely to be locally excessively thin. As a result, the possibility of occurrence of a leak path in a current steering element is reduced, so that it is possible to prevent deterioration of the electric characteristics of the current steering element, such as an increase in a leak current and a decrease in a breakdown voltage.

Thus, only a sufficiently small leak current flows from a non-selected cell to which an off-state voltage is applied, so that it is possible to substantially reduce the read-disturb. This facilitates enlargement of a matrix size.

As a result, the ratio of an area of the peripheral circuit to an area of the memory cell array can be reduced, thereby facilitating further integration for implementing a large-capacity nonvolatile storage device.

The following describes a method of manufacturing the memory cell array according to Embodiment 1, focusing on one memory cell included in the memory cell array.

FIG. 2(a) to (f) illustrates cross-sectional views in processing which show an example of the manufacturing method of the memory cell according to Embodiment 1.

As shown in FIG. 2(a), the first conductive layer 2 is formed on the semiconductor substrate 1. The first conductive layer 2 is a portion of a line obtained by depositing an alloy layer of aluminum and copper using sputtering and performing patterning using dry etching, for example.

Next, a silicon oxide film that becomes the first interlayer insulating film 3 is formed using CVD on the semiconductor substrate 1 to cover the first conductive layer 2. Then, the plug 4 penetrating through the first interlayer insulating film 3 and connected to the first conductive layer 2 is formed. When the first plug 4 is formed, a level difference is generated between an upper surface of the first plug 4 and an upper surface of the first interlayer insulating film 3, so that the first concave portion 5 is formed, as described in FIG. 12.

The first plug 4 is formed by depositing the tungsten film using CVD and polishing the deposited tungsten film using CMP until the upper surface of the first interlayer insulating film 3 is exposed.

The polish rate for the tungsten film in CMP is 200 nm per minute, and the polish rate for the first interlayer insulating film 3 is 30 nm per minute. Here, the polish rate for the tungsten film is higher than the polish rate for the silicon oxide film that is the first interlayer insulating film 3, so that it is possible to prevent leaving a portion of tungsten after polishing, on the first interlayer insulating film 3. Then, since over-polishing is performed, a level difference is generated between the upper surface of the first plug 4 and the upper surface of the first interlayer insulating film 3, so that the first concave portion 5 is formed in the upper surface of the first plug 4.

In addition, when the first plug 4 is formed using tungsten, the depth of the first concave portion 5 becomes larger also due to chemical functioning caused by slurry that is a polishing agent (functioning caused by an oxidizing agent such as hydrogen peroxide solution or potassium sulfate).

The depth of the first concave portion 5 generated as a result of chemical functioning and mechanical action using CMP is 10 to 40 nm.

Next, a conductive film 6a that becomes the first electrode 6 is deposited on the first interlayer insulating film 3 to cover the upper surface of the first plug 4, as shown in FIG. 2(b). At this time, the second concave portion 7 is formed into the shape to which the shape of the first concave portion 5 is transferred, in the upper surface of the conductive film 6a immediately above the first concave portion 5. The depth of the second concave portion 7 is substantially the same as the depth of the first concave portion 5, at this time.

As an example, the conductive film 6a is formed by depositing tantalum nitride having conductivity for 60 to 80 nm, using sputtering. In addition, the second concave portion 7 has a depth of 10 to 40 nm that is substantially the same as the depth of the first concave portion 5.

Next, as shown in FIG. 2(c), the conductive film 6a is polished for 20 to 50 nm by CMP using the slurry for Cu polishing until the second concave portion 7 disappears and the upper surface of the conductive film 6a becomes substantially flat. In this CMP, the conductive film 6a is polished until the height of the entire upper surface becomes uniform to be the same height as the height of the lowest portion.

As an example, when the first electrode 6 is tantalum nitride, the polish rate for the tantalum nitride in CMP is 60 nm per minute. The time for polishing is 20 to 50 seconds, and the first electrode of the tantalum nitride can be polished for 20 to 50 nm. In addition, in CMP, the tantalum nitride film having a high adhesion to the first interlayer insulating film 3 or the first plug 4 can be polished without peeling off.

Next, as shown in FIG. 2(d), a semiconductor or insulation film 8a that becomes the current steering layer 8 is deposited on the conductive film 6a having an upper surface formed substantially flat, and a conductive film 9a that becomes the second electrode 9 is deposited on the semiconductor or insulation film 8a.

As an example, the semiconductor or insulation film 8a is formed by depositing silicon nitride for 10 nm, using sputtering. Furthermore, the conductive film 9a is formed by depositing tantalum nitride for 50 nm, using sputtering.

Next, as shown in FIG. 2(e), a current steering element 10 including the first electrode 6, the current steering layer 8, and the second electrode 9 is formed by performing patterning, using dry etching, on the conductive film 6a, the semiconductor or insulation film 8a, and the conductive film 9a.

Next, as shown in FIG. 2(f), the second interlayer insulating film 11 is formed on the first interlayer insulating film 3 to cover the current steering element 10. Next, the second plug 12 penetrating through the second interlayer insulating film 11 and connected to the second electrode 9 is formed. Then, an electrode film, a variable resistance film, and an electrode film which become the lower electrode 20, the variable resistance layer 21, and the upper electrode 22 of the variable resistance element 23, respectively, are deposited in this order, and patterning is performed using dry etching, so that the variable resistance element 23 is formed.

The variable resistance film that becomes the variable resistance layer 21 is formed mainly of an oxygen-deficient transition metal oxide, and may include a slight amount of impurities for adjusting a resistance value, and so on. Such a variable resistance film is formed by performing reactive sputtering using a transition metal as a target material. It is to be noted that the oxygen content percentage in the variable resistance film can be adjusted by adjusting a flow ratio of an oxygen gas to an argon gas in the sputtering.

Furthermore, the third interlayer insulating film 18 is formed to cover the variable resistance element 23 and the second interlayer insulating film 11. Next, the contact hole which penetrates through the third interlayer insulating film 18 to reach the upper electrode 22 of the variable resistance element 23 is formed. Then a metal film that becomes the third plug 19 is deposited in the contact hole and on the upper surface of the third interlayer insulating film 18, and then the deposited metal film is polished using CMP or etch back until the third interlayer insulating film 18 is exposed, thereby forming the third plug 19.

Then, the second conductive layer 14 connected to the third plug 19 is formed, and the passivation film 15 is formed to cover the second conductive layer 14 and the third interlayer insulating film 18.

Through the processing described above, the formation of the memory cell according to Embodiment 1 is accomplished. The memory cell array can be manufactured by forming a plurality of memory cells on the semiconductor substrate 1 according to the manufacturing method described above.

Embodiment 2

Figure 3:
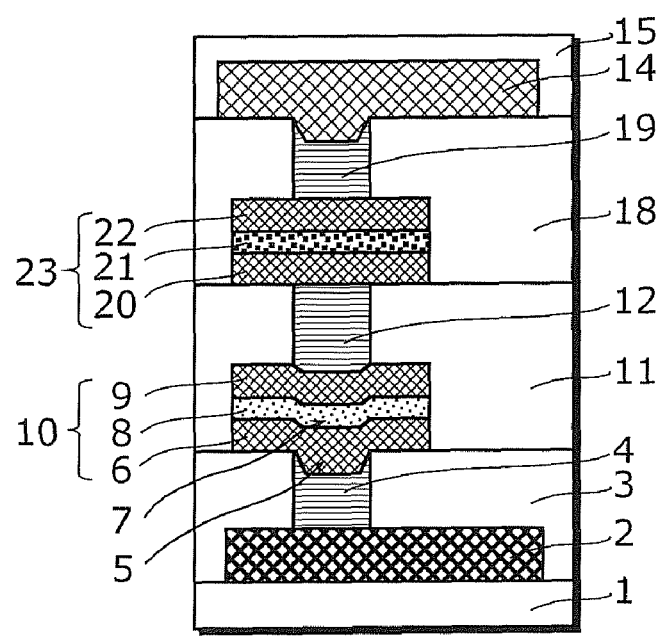
FIG. 3 is a schematic cross-sectional diagram which shows an example of a configuration of a memory cell according to Embodiment 2 of the present invention.
Figure 4:
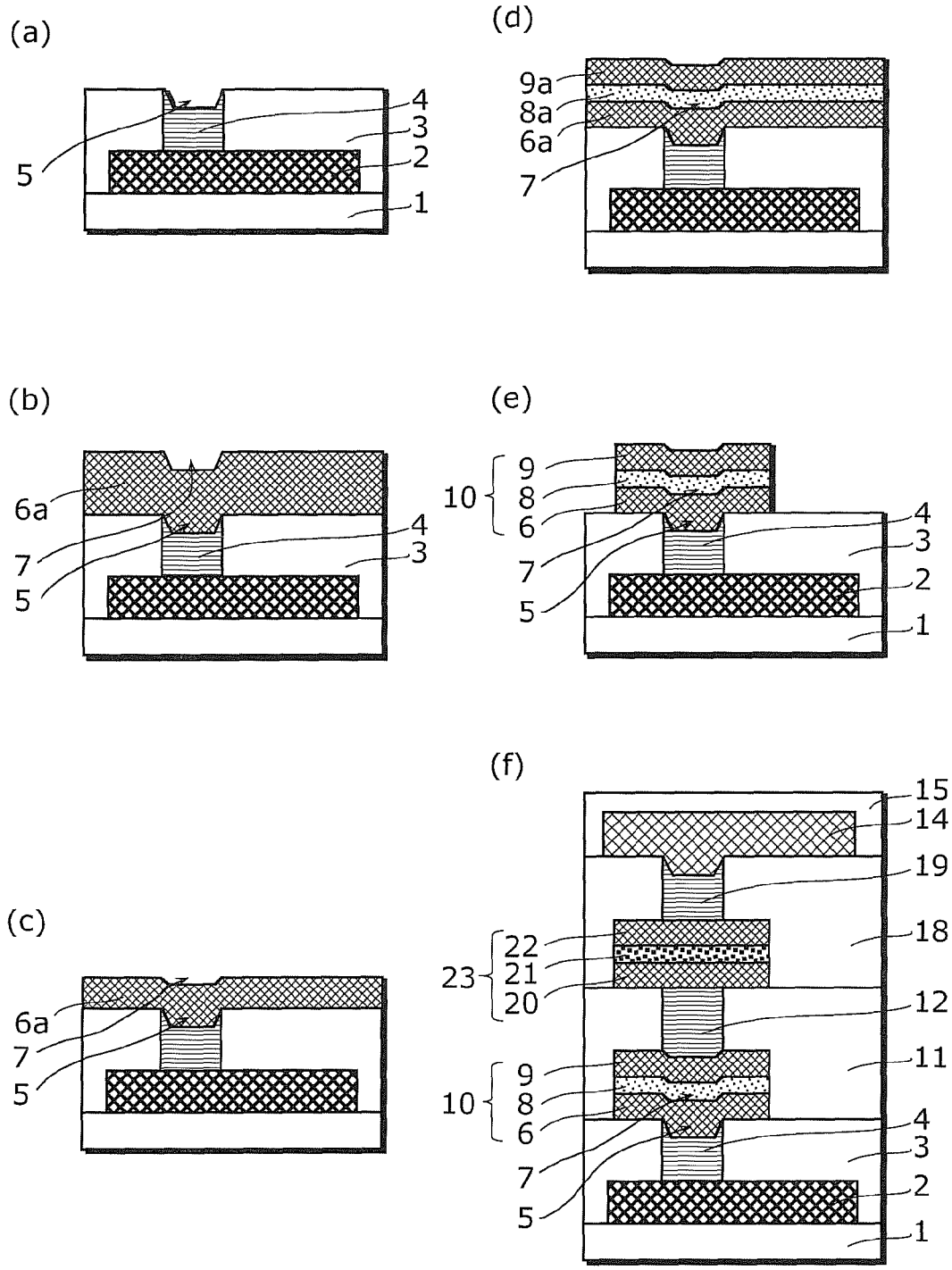
FIG. 4(a) to (f) illustrates sectional views in processing which show an example of a manufacturing method of a memory cell according to Embodiment 2 of the present invention.

The following describes, with reference to FIG. 3 and FIG. 4, a memory cell according to Embodiment 2 of the present invention.

FIG. 3 is a schematic cross-sectional diagram which shows an example of a configuration of the memory cell according to Embodiment 2.

As shown in FIG. 3, the memory cell according to Embodiment 2 is different from the memory cell according to Embodiment 1, in that the upper surface of the first electrode 6 positioned immediately above the first plug 4 is shaped to have a concave toward the substrate. This concave is called a second concave portion 7. The second concave portion 7 has a depth smaller than the depth of the first concave portion 5.

The memory cell according to Embodiment 2 is different from the memory cell according to Embodiment 1, in that the second concave portion 7 included in the upper surface of the first electrode 6 is included and that the current steering layer 8 and the second electrode 9 positioned above the second concave portion 7 have the shapes different from those in the memory cell according to Embodiment 1. However, the memory cell according to Embodiment 2 and the memory cell according to Embodiment 1 are the same in the number of layers stacked and materials used for respective layers. In the following description, each structural element in the memory cell according to Embodiment 2 is indicated, for convenience sake, using the numeral same as a corresponding structural element in the memory cell according to Embodiment 1.

Since the second concave portion 7 is shallower than the first concave portion 5 in the memory cell according to Embodiment 2, the current steering layer 8 is less likely to be locally excessively thin, compared to the memory cell of the comparison example in which the second concave portion 7 and the first concave portion 5 have approximately the same depth. As a result, the possibility of occurrence of a leak path in a current steering element is reduced, so that it is possible to prevent deterioration of the electric characteristics of the current steering element, such as an increase in a leak current and a decrease in a breakdown voltage.

Thus, only a sufficiently small leak current flows from a non-selected cell to which an off-state voltage is applied, so that it is possible to substantially reduce the read-disturb and the write-disturb. This facilitates enlargement of a matrix size.

As a result, the ratio of an area of the peripheral circuit to an area of the memory cell array can be reduced, thereby facilitating further integration for implementing a large-capacity nonvolatile storage device.

The following describes a method of manufacturing the memory cell array according to Embodiment 2, focusing on one memory cell included in the memory cell array.

FIG. 4(a) to (f) illustrates cross-sectional views in processing which show an example of the manufacturing method of the memory cell according to Embodiment 2.

First, as shown in FIGS. 4(a) and (b), the first conductive layer 2, the first interlayer insulating film 3, the first plug 4, and the conductive film 6a are formed above the semiconductor substrate 1. This process is the same as the process described regarding FIGS. 2(a) and (b) in Embodiment 1.

Next, as shown in FIG. 4(c), the conductive film 6a is polished for 10 to 30 nm by CMP using the slurry for Cu polishing such that the second concave portion 7 is shallow and the flatness of the upper surface of the conductive film 6a improves. In this CMP, the conductive film 6a is polished to the extent that the second concave portion 7 shallowly remains.

As an example, when the first electrode 6 is tantalum nitride, the polish rate for the tantalum nitride in CMP is 60 nm per minute. The time for polishing is 10 to 30 seconds, and the first electrode of the tantalum nitride can be polished for 10 to 30 nm. In addition, in CMP, the tantalum nitride film having a high adhesion to the first interlayer insulating film 3 or the first plug 4 can be polished without peeling off.

Next, as shown in FIG. 4(d), a semiconductor or insulation film 8a that becomes the current steering layer 8 is deposited on the conductive film 6a having an upper surface with improved flatness, and a conductive film 9a that becomes the second electrode 9 is deposited on the semiconductor or insulation film 8a.

As an example, the semiconductor or insulation film 8a is formed by depositing silicon nitride for 10 nm, using sputtering. Furthermore, the conductive film 9a is formed by depositing tantalum nitride for 50 nm, using sputtering.

Next, as shown in FIGS. 4(e) and (d), the current steering element 10 is formed, and then the second interlayer insulating film 11, the second plug 12, the variable resistance element 23, the third interlayer insulating film 18, the third plug 19, the second conductive layer 14, and the passivation film 15 are formed. This process is the same as the process described regarding FIGS. 2(e) and (f) in Embodiment 1.

Through the processing described above, the formation of the memory cell according to Embodiment 2 is accomplished. The memory cell array can be manufactured by forming a plurality of memory cells on the semiconductor substrate 1 according to the manufacturing method described above.

Since the conductive film 6a is formed not to be completely flat with the manufacturing method according to Embodiment 2, it is possible to reduce a film thickness of the conductive film 6a required when starting polishing and the amount of polishing of the first electrode 6.

This reduces variation in the film thickness of the remaining first electrode 6, stabilizes the dry etching processing of the first electrode 6, and reduces the amount of time taken for over-etching, thereby producing advantageous effects of reduced processing and an improved yield rate.

Embodiment 3

Figure 5:
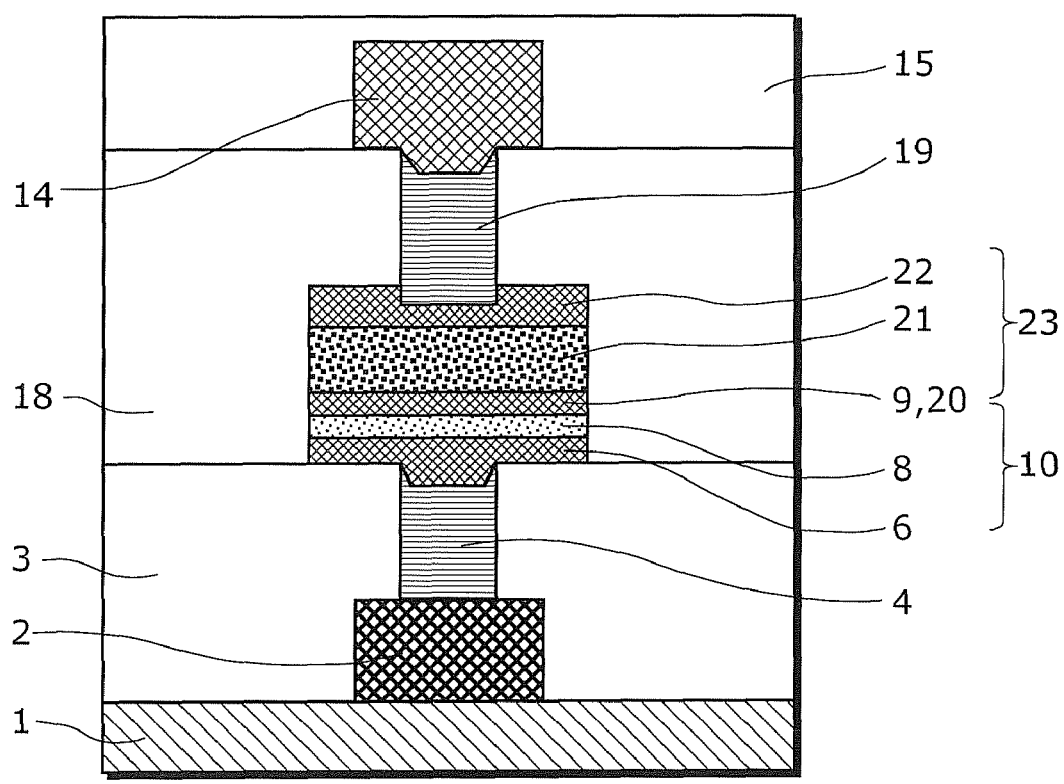
FIG. 5 is a schematic cross-sectional diagram which shows an example of a configuration of a memory cell according to Embodiment 3 of the present invention.
Figure 6:
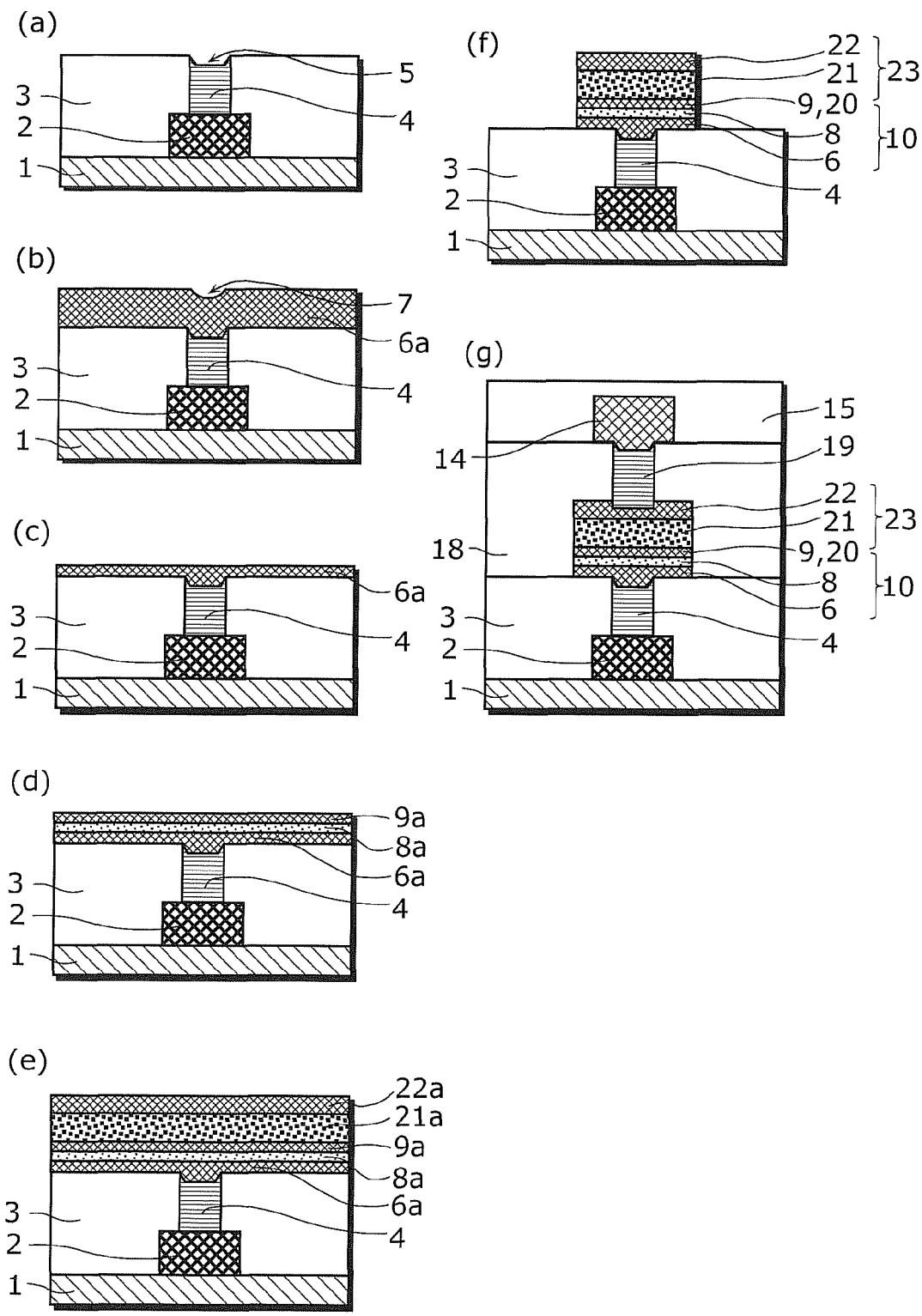
FIG. 6(a) to (g) illustrates sectional views in processing which show an example of a manufacturing method of a memory cell according to Embodiment 3 of the present invention.

The following describes, with reference to FIG. 5 and FIG. 6, a memory cell according to Embodiment 3 of the present invention.

FIG. 5 is a schematic cross-sectional diagram which shows an example of a configuration of the memory cell according to Embodiment 3.

In the memory cell according to Embodiment 3 as shown in FIG. 5, the second electrode 9 of the current controlling element 10 in the memory cell according to Embodiment 1 doubles as the variable resistance element 23 of the current controlling element 10 in the memory cell according to Embodiment 1, thereby integrating the current steering element 10 and the variable resistance element 23. In addition, the second interlayer insulating film 11 and the second plug 12 included in the memory cell according to Embodiment 1 are omitted.

The memory cell according to Embodiment 3 is formed in the same manner as in the memory cell according to Embodiment 1 other than the difference described above. In the following description, each structural element in the memory cell according to Embodiment 3 is indicated, for convenience sake, using the numeral same as a corresponding structural element in the memory cell according to Embodiment 1.

Since the upper surface of the first electrode 6 positioned immediately above the first plug 4 is formed substantially flat in the memory cell according to Embodiment 3 as in the memory cell according to Embodiment 1, the current steering layer 8 is less likely to be locally excessively thin. As a result, the possibility of occurrence of a leak path in a current steering element is reduced, so that it is possible to prevent deterioration of the electric characteristics of the current steering element, such as an increase in a leak current and a decrease in a breakdown voltage.

Thus, only a sufficiently small leak current flows from a non-selected cell to which an off-state voltage is applied, so that it is possible to substantially reduce the read-disturb and the write-disturb. This facilitates enlargement of a matrix size.

As a result, the ratio of an area of the peripheral circuit to an area of the memory cell array can be reduced, thereby facilitating further integration for implementing a large-capacity nonvolatile storage device.

In addition to the above, since the current steering element 10 and the variable resistance element 23 are integrated in the memory cell according to Embodiment 3, it is possible to omit the second plug 12 which is necessary when the current steering element 10 and the variable resistance element 23 are individually formed. The omission of the second plug 12 reduces parasitic capacitance and thus causes less signal delay, thereby implementing a high-speed operation.

In addition, since it is not necessary to form the second plug 12, it is possible to simplify the manufacturing method, thereby producing an advantageous effect of a reduction in manufacturing costs.

The following describes a method of manufacturing the memory cell array according to Embodiment 3, focusing on one memory cell included in the memory cell array.

FIG. 6(a) to (g) illustrates cross-sectional views in processing which show an example of the manufacturing method of the memory cell according to Embodiment 3.

First, as shown in FIG. 6(a) to (c), the first conductive layer 2, the interlayer insulating film 3, the first plug 4, and the conductive film 6a are formed above the semiconductor substrate 1 and the upper surface of the conductive layer 6a is formed flat. This process is the same as the process described regarding FIG. 2(*a*) to (*c*) in Embodiment 1.

Next, as shown in FIG. 6(*d*), a semiconductor or insulation film 8a that becomes the current steering layer 8 is deposited on the conductive film 6a having an upper surface formed flat, and a conductive film 9a that becomes the second electrode 9 is deposited on the semiconductor or insulation film 8a.

As an example, the semiconductor or insulation film 8a is formed by depositing silicon nitride for 10 nm, using sputtering. Furthermore, the conductive film 9a is formed by depositing tantalum nitride for 50 nm, using sputtering. The conductive film 9a is used as the second electrode 9 and also as the lower electrode 20 of the variable resistance element 23.

Next, as shown in FIG. 6(*e*), a variable resistance layer 21a that becomes the variable resistance film 21 and an electrode film 22a that becomes the upper electrode 22 of the variable resistance element 23 are deposited in this order above the conductive film 9a. With this, a stacked film in which films from the conductive film 6a to the electrode film 22a are stacked is formed.

Next, as shown in FIG. 6(*f*), patterning is performed using dry etching on the stacked film formed by deposition in the processing of FIGS. 6(*d*) and (*e*), thereby forming the current steering element 10 and the variable resistance element 23 at the same time. The current steering element 10 includes: the first electrode 6; the current steering layer 8; and the second electrode 9. The variable resistance element 23 includes: the lower electrode 20 that is the second electrode 9; the variable resistance layer 21; and the upper electrode 22.

Lastly, as shown in FIG. 6(*g*), the third interlayer insulating film 18; the third plug 19; the second conductive layer 14; and the passivation film 15 are formed. This process is the same as the process described regarding FIG. 2(*f*) in Embodiment 1.

Through the processing described above, the formation of the memory cell according to Embodiment 3 is accomplished. The memory cell array can be manufactured by forming a plurality of memory cells on the semiconductor substrate 1 according to the manufacturing method described above.

With the manufacturing method according to Embodiment 3, it is not necessary to form the second plug 12 that is formed in Embodiment 1 because the current steering element 10 and the variable resistance element 23 are integrally formed. Therefore, it is possible to simplify the manufacturing method, thereby producing an advantageous effect of a reduction in manufacturing costs.

(Cross-Sectional Observation and Verification of Electric Characteristics of the Current Steering Element in the Embodiments)

A current steering element was manufactured according to each of the manufacturing methods of Embodiment 1 and Embodiment 2 and cross-sectional observation was carried out, and experimentation was carried out for obtaining leak current characteristic and breakdown characteristic as electric characteristics. The following describes the outcome of the experimentation.

In the following description, the current steering elements manufactured according to the manufacturing methods of Embodiment 1 and Embodiment 2 are called an example 1 and an example 2, respectively, and the current steering element manufactured according to the conventional manufacturing method described above is called a comparison example.

<Cross-Sectional Observation>

FIG. 7(*a*) is an SEM photomicrographs of a cross-sectional view of the current steering element 10 according to the example 1 and FIG. 7(*b*) is a cross-sectional view of a schematic diagram thereof. The same numeral of each of the structural elements in FIG. 1(*a*) is attached to a corresponding one of the structural elements of the current steering element 10, and the description therefore is omitted.

As shown in FIGS. 7(*a*) and (*b*), the first concave portion 5 is formed on the upper surface of the first plug 4 and the upper surface of the first electrode 6 is formed substantially flat. Here, the depth A of the first concave portion is 25 nm and the film thickness C of the current steering layer 8 is 10 nm. The second concave portion 7 as seen in the comparison example of FIGS. 13(*a*) and (*b*) is nearly absent in the example 1. The depth B of the second concave portion 7 is approximately 0 nm in the example 1.

The first electrode 6 and the second electrode 9 are tantalum nitride and the current steering layer 8 is silicon nitride. Sine the first interlayer insulating film 3 and the second interlayer insulating film 11 are formed using the same material, it is difficult to see a boundary between the first interlayer insulating film 3 and the second interlayer insulating film 11 from the SEM photomicrographs of the cross-sectional view.

In addition, it is also difficult to identify a boundary between the second plug 12 and the second electrode 9 due to an indistinct configuration caused by an adhesion layer interposed therebetween or a roughness in a underlying growth layer. Thus, illustration of the boundaries is omitted in the cross-sectional view of the schematic diagram of FIG. 7(*b*).

FIG. 8(*a*) is a SEM photomicrographs of a cross-sectional view of the current steering element 10 according to the example 2 and FIG. 8(*b*) is a cross-sectional view of the schematic diagram thereof. The same numeral of each of the structural elements in FIG. 3 is attached to a corresponding one of the structural elements of the current steering element 10, and the description therefore is omitted.

As shown in FIGS. 8(*a*) and (*b*), the first concave portion 5 is formed on the upper surface of the first plug 4 and the second concave portion 7 is formed on the upper surface of the first electrode 6. Here, the depth A of the first concave portion is 35 nm, the depth B of the second concave portion 7 is 24 nm, and the film thickness C of the current steering layer 8 is 10 nm.

It is confirmed, in the current steering element 10 of the example 2, that the depth B of the second concave portion 7 is smaller than the depth A of the first concave portion 5. In addition, it is confirmed that the current steering layer 8 does not include a locally thin portion in the film thickness.

<Leak Current Characteristic>

Figure 9:
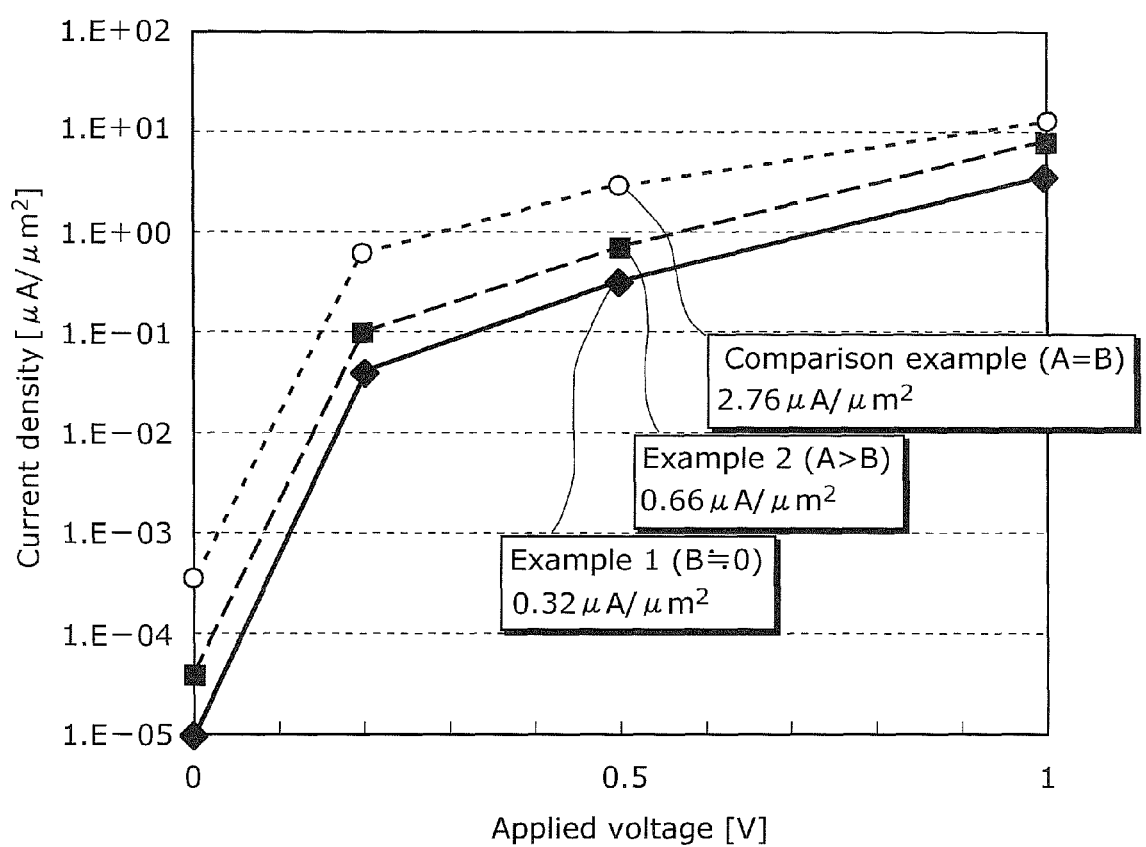
FIG. 9 is a graph which shows applied voltage-current density characteristics of the current steering element according to each of a comparison example, the example 1, and the example 2.

FIG. 9 is a graph which shows an applied voltage-current density characteristic of the current steering element 10 according to each of the comparison example, the example 1, and the example 2. This graph shows the applied voltage-current density characteristic measured from a sample of the current steering element 10 of each of the comparison example, the example 1, and the example 2.

The current density that defines a leak current of the current steering element when the applied voltage is 0.5 V is 2.76 $\mu A/\mu m^2$ in the comparison example, whereas 0.32 $\mu A/\mu m^2$ in the example 1 and 0.66 $\mu A/\mu m^2$ in the example 2.

It is to be noted that, although not shown in FIG. 9, the current density that defines an on-state current of the current steering element when the applied voltage is 2V is the same among the comparison example, the example 1, and the example 2. Further, the current densities when the applied voltage is 0V are currents in a range of an error caused by using an experiment device.

In a memory cell array in which $N^2$ memory cells are arranged in a matrix of N×N, the main leak current that disturbs reading of a selected cell is a sum of leak currents flowing through 2×(N−1) non-selected cells connected to bit lines and word lines connected to the selected element. Thus, the requirement for correctly reading the resistance state of the selected cell is that the sum of leak currents flowing through the non-selected cells is smaller than a threshold current for reading.

It is confirmed that, in a memory cell array in which memory cells using the non-volatile storage element including the current steering element and the variable resistance element according to the example 1 connected to each other in series are arranged in a matrix of 128 cells×128 cells, the sum of leak currents flowing through the non-selected cells is approximately 85 $\mu A/\mu m^2$ when the read determination current of each of the memory cells is set at 100 $\mu A/\mu m^2$, and thus the resistance state of the selected cell can be correctly read.

On the other hand, in a memory cell array in which memory cells using the non-volatile storage element including the current steering element and the variable resistance element according to the comparison example connected to each other in series are arranged in a matrix, since a variation among current steering elements is large, in addition to a large leak current from the current steering elements, an obtained result shows that the maximum size of the matrix that can correctly read the resistance state of the selected cell is 4 cells×4 cells.

As described above, it is confirmed that, in the memory cell array using, as a memory cell, the non-volatile storage element including the current steering element and the variable resistance element of the examples, it is possible to enlarge the matrix size compared to the memory cell array using, as a memory cell, the non-volatile storage element including the current steering element and the variable resistance element of the comparison example.

Thus, the ratio of an area of the peripheral circuit to an area of the memory cell array can be reduced by enlarging the matrix size according to the memory cell array of the present invention, thereby facilitating further integration for implementing a large-capacity nonvolatile storage device.

<Breakdown Characteristic>

FIGS. 10(a) and (b) is a graph which shows a breakdown characteristic of the current steering element 10 according to each of the comparison example and the example 1. Each of FIGS. 10(a) and (b) corresponds to a different composition and a different thickness of the current steering layer 8.

FIG. 10(a) shows the breakdown characteristic of each of the comparison example and the example 1 in the case where the composition of a nitrogen deficient silicon nitride included in the current steering layer 8 is $SiN_x$ (X=0.6) and the film thickness is 15 nm.

FIG. 10(b) shows the breakdown characteristic of each of the comparison example and the example 1 in the case where the composition of a nitrogen deficient silicon nitride included in the current steering layer 8 is $SiN_x$ (X=0.7) and the film thickness is 10 nm.

Under each of the two conditions regarding the current steering layer 8, a current increases when an applied voltage is increased and the current steering layer 8 breaks down when the applied voltage reaches a breakdown voltage, and the current rapidly increases.

In FIG. 10(a), the breakdown voltage of the comparison example is 4.4V, whereas the breakdown voltage of the example 1 is 4.9V, and in FIG. 10(b), the breakdown voltage of the comparison example is 4.2V, whereas the breakdown voltage of the example 1 is 4.8V.

As described above, it is confirmed that the current steering element of the example 1 has the breakdown voltage higher than the breakdown voltage of the current steering element of the comparison example, in each of the two conditions regarding the current steering layer 8.

Therefore, with the memory cell array using, as a memory cell, the non-volatile storage element including the current steering element and the variable resistance element according to the present invention, it is possible to improve the breakdown voltage of the current steering element, and thus the reliability of the nonvolatile storage device can be improved.

INDUSTRIAL APPLICABILITY

A memory cell array and a manufacturing method thereof according to the present invention can be applied to a non-volatile storage element including a current steering element in which a leak current is suppressed and a variable resistance element are connected to each other in series, a memory cell using such a non-volatile storage element, and a memory cell array in which such memory cells are arranged in a matrix, and useful as, in particular, a nonvolatile storage device using the phenomenon in which resistance changes.

REFERENCE SIGNS LIST 1 semiconductor substrate
2 first conductive layer
3 first interlayer insulating film
4 first plug
5 first concave portion
6 first electrode
6a conductive film
7 second concave portion
8 current steering layer
8a semiconductor or insulation film
9 second electrode
9a conductive film
10 current steering element
11 second interlayer insulating film
12 second plug
14 second conductive layer
15 passivation film
16 contact hole
17 plug material
18 third interlayer insulating film
19 third plug
20 lower electrode
21 variable resistance layer
21a variable resistance film
22 upper electrode
22a electrode film
23 variable resistance element
24 memory cell
25, 26 decoder

The invention claimed is:

1. A memory cell array comprising:
a semiconductor substrate;
first conductive layers arranged to extend in parallel to each other on said semiconductor substrate;
an interlayer insulating film formed to cover said first conductive layers;
second conductive layers arranged above said interlayer insulating film to extend in parallel to each other and to three-dimensionally cross with said first conductive layers;
plugs each formed to penetrate through said interlayer insulating film and to have a lower surface electrically connected to a corresponding one of said first conductive layers at a corresponding one of three-dimensional cross points between said first conductive layers and said second conductive layers; and memory cells each formed between, and electrically connected to, an upper surface of a corresponding one of said plugs and a corresponding one of said second conductive layers, at the corresponding one of three-dimensional cross points between said first conductive layers and said second conductive layers, wherein each of said memory cells includes:

a current steering element formed to cover said upper surface of the corresponding one of said plugs, said current steering element having a nonlinear current-voltage characteristic, and a variable resistance element which is electrically connected in series to said current steering element and has a resistance value that reversibly changes in response to an application of a voltage pulse, said upper surface of each of said plugs is formed to have a first concave shape, said current steering element includes: a first electrode that covers said upper surface of the corresponding one of said plugs; a current steering layer formed on said first electrode; and a second electrode formed on said current steering layer, and said first electrode is thicker above a center portion than above a peripheral portion of said upper surface of the corresponding one of said plugs, by a maximum of a depth of the first concave shape.

2. The memory cell array according to claim 1,
wherein said first electrode has an upper surface having a second concave shape above said upper surface of the corresponding one of said plugs, the second concave shape having a depth smaller than a thickness of said current steering layer.

3. The memory cell array according to claim 1,
wherein said first electrode has an upper surface formed substantially flat above said upper surface of the corresponding one of said plugs.

4. The memory cell array according to claim 1,
wherein said variable resistance element includes: a variable resistance layer formed in contact with said second electrode of said current steering element; and a third electrode formed on said variable resistance layer, said second electrode, said variable resistance layer, and said third electrode forming a stacked structure of said variable resistance element.

5. The memory cell array according to claim 1,
wherein said first electrode or said second electrode includes tantalum nitride and said current steering layer includes silicon nitride.

6. A nonvolatile storage device comprising:
the memory cell array according to claim 1; and
a decoder for driving the memory cell array.

7. A memory cell formed on a plug that includes a concave surface exposed to a surface of an interlayer insulating film, said memory cell comprising:

a current steering element formed to cover the surface of the plug and having a nonlinear current-voltage characteristic; and a variable resistance element which is electrically connected in series to said current steering element and has a resistance value that reversibly changes in response to an application of a voltage pulse, wherein said current steering element includes: a first electrode that covers the surface of the plug; a current steering layer formed on said first electrode; and a second electrode formed on said current steering layer, and said first electrode is thicker above a center portion than above a peripheral portion of the surface of the plug, by a maximum of a depth of the first concave shape of the surface of the plug.

* * * * *